United States Patent
Kim

(10) Patent No.: US 9,941,164 B1
(45) Date of Patent: Apr. 10, 2018

(54) SELF-ALIGNED BLOCK PATTERNING WITH DENSITY ASSIST PATTERN

(71) Applicant: SAMSUNG ELECTRONICS CO., LTD., Suwon-si, Gyeonggi-Do (KR)

(72) Inventor: Seong Jong Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/623,862

(22) Filed: Jun. 15, 2017

Related U.S. Application Data

(60) Provisional application No. 62/430,056, filed on Dec. 5, 2016.

(51) Int. Cl.
| | |
|---|---|
| *H01L 21/033* | (2006.01) |
| *H01L 21/768* | (2006.01) |
| *H01L 21/308* | (2006.01) |
| *H01L 21/311* | (2006.01) |

(52) U.S. Cl.
CPC .... *H01L 21/76897* (2013.01); *H01L 21/0337* (2013.01); *H01L 21/0338* (2013.01); *H01L 21/3083* (2013.01); *H01L 21/3086* (2013.01); *H01L 21/3088* (2013.01); *H01L 21/31144* (2013.01); *H01L 21/76816* (2013.01); *H01L 21/76877* (2013.01)

(58) Field of Classification Search
CPC ........ H01L 21/70; H01L 21/702; H01L 21/71
See application file for complete search history.

(56) References Cited

U.S. PATENT DOCUMENTS

2016/0293478 A1   10/2016   Yuan et al.

*Primary Examiner* — Cheung Lee
(74) *Attorney, Agent, or Firm* — F. Chau & Associates, LLC

(57) ABSTRACT

A method of generating mask layouts for self-aligned block patterning is provided. Metal line patterns to be formed on a semiconductor substrate is identified. A mandrel mask layout for first mask based on the metal line patterns is generated in view of a self-aligned double patterning (SADP) process for forming a plurality of mandrels on the semiconductor substrate. The mandrel mask layout may include a plurality of mandrel patterns. A non-mandrel block mask layout for second mask is generated based on the mandrel mask layout for cutting metal lines formed under gaps between spacers in non-mandrel area on the semiconductor substrate. The non-mandrel block mask layout may include a plurality of first block patterns and a plurality of first density assist patterns. A mandrel block mask layout for third mask is generated based on the mandrel mask layout for cutting metal lines formed under mandrel area on the semiconductor substrate.

26 Claims, 16 Drawing Sheets

SELF-ALIGNED BLOCK PATTERNING WITH DENSITY ASSIST PATTERN

CROSS-REFERENCE TO RELATED APPLICATION

This application claims the benefit under 35 U.S.C. § 119(e) to U.S. Provisional Patent Application No. 62/430,056, filed on Dec. 5, 2016 in the United States Patent & Trademark Office, the disclosure of which is incorporated by reference herein in its entirety.

TECHNICAL FIELD

This invention relates generally to a method of generating mask layouts including density assist patterns for self-aligned block patterning process, a method of using masks with the layouts, and a method of manufacturing an integrated circuit using masks with the layouts.

DISCUSSION OF RELATED ART

In the fabrication of integrated circuits, lithography is used to generate pattern structures on the semiconductor and various materials for the construction of the desired circuit structures. A continuing demand in view of the ever-increasing desire in the semiconductor industry for higher circuit density in microelectronic devices has prompted lithographic engineers to develop improved lithographic processes. As the circuit density of semiconductor devices increases, higher resolution of circuit patterns in resist films is increasingly demanded. One way of improving the resolution in resist is to migrate to shorter wavelength from 365 nm to 248 nm, then to 193 nm, and further to extremely short optical wavelengths like EUV (extreme ultraviolet), or to adopt non-optical system such as E-beam. Another way of achieving the high resolution of circuit patterns is to adopt multiple patterning such as double, triple and quadruple patterning. In addition, one technique emerged, which may only require ArF (193 nm) deep UV (DUV) immersion lithography initially in combination with spacer deposition, is called sidewall image transfer (SIT). This spacer based SIT technique can print very fine features by doubling, quadrupling or sextupling the pattern density with multiple deposition and etching schemes. The advanced patterning processes may include the combination of both multiple patterning and the SIT technique using 193 nm exposure, and may also include EUV lithography.

In the traditional multiple patterning process, such as, double patterning may include a litho-etch-litho-etch (LELE) patterning technique. In LELE, the layout is broken into two masks (two patterns), and the second mask is aligned with respect to the first during the patterning process, thus it may have misalignment concern. Self-aligned double patterning (SADP) generates the pitch split pattern using spacers that are self-aligned to the litho-etch step, thereby overcoming the alignment issue. For SADP, two spacers are formed on two side surfaces of each mandrel line, thus two spacer lines are formed after removing each mandrel. SADP may be used to fabricate metal lines. Metal lines that are defined by mandrel patterns are often called mandrel metals while other metal lines are called non-mandrel metals. A block mask may be used to isolate portions not to be etched. Current issue for block patterning is very low density, it causes a mask uniformity issue, and the non-uniform mask pattern is transferred to wafer. Recently, a new process named self-aligned block (SAB) scheme taking advantage of the high etch selectivity between different patterning stack materials is introduced to achieve self-alignment for the block pattern with respect to the trench grid. The SAB scheme uses 2 block/cut masks, thereby causing the layout density to drop even more. In case of EUV mask, there are natural defects on the blank, and the defects may cause unwanted pattern being printed on the wafer. Lower pattern density increases the probability of fabricating defective EUV mask. In addition, photoresists used in fabricating masks are usually positive tone, lower pattern density will require longer E-beam writing time, which not only hurts throughput also causes critical dimension (CD) errors. Therefore, there is a need to address the low pattern density issue associated with the block mask layout used in the SAB process to ensure that the fabricated metal lines have pattern uniformity.

SUMMARY

According to an aspect of the present invention, there is provided a method of generating mask layouts for self-aligned block patterning including: identifying metal line patterns to be formed on a semiconductor substrate; generating a mandrel mask layout for first mask based on the metal line patterns in view of a self-aligned double patterning (SADP) process for forming a plurality of mandrels on the semiconductor substrate, the mandrel mask layout including a plurality of mandrel patterns; generating a non-mandrel block mask layout for second mask based on the mandrel mask layout for cutting metal lines formed under gaps between spacers in non-mandrel area on the semiconductor substrate, the non-mandrel block mask layout including a plurality of first block patterns and a plurality of first density assist patterns; and generating a mandrel block mask layout for third mask based on the mandrel mask layout for cutting metal lines formed under mandrel area on the semiconductor substrate, the mandrel block mask layout including a plurality of second block patterns and a plurality of second density assist patterns, in which, the spacers are formed on both sidewalls of each of the plurality of mandrels on the semiconductor substrate in the SADP process, combination of the plurality of first block patterns and the plurality of first density assist patterns has a pattern density about 30% or greater in the non-mandrel block mask layout, and combination of the plurality of second block patterns and the plurality of second density assist patterns has a pattern density about 30% or greater in the mandrel block mask layout.

According to another aspect of the present invention, there is provided a self-aligned block patterning method including: providing a substrate including a first hard mask layer and a second hard mask layer over a dielectric layer, with the second hard mask layer being on top of the first hard mask layer; forming a plurality of mandrels and a plurality of spacers on the second hard mask layer, with two spacers being on both sidewalls of each mandrel and a non-mandrel gap formed between two adjacent spacers; performing non-mandrel block photolithography process using non-mandrel block mask to form first block photoresist patterns for cutting non-mandrel metal lines and first dummy photoresist patterns overlapping the mandrels, with the non-mandrel block mask including first block mask patterns and first density assist mask patterns; removing the second hard mask layer under the non-mandrel gaps not overlapped by the first block photoresist patterns through etching; performing mandrel block photolithography process using mandrel block mask to form second block photoresist patterns for cutting mandrel metal lines and second dummy photoresist patterns overlapping the non-mandrel gaps, with the mandrel block mask including second block mask patterns and second density assist mask patterns; removing the second hard mask layer under the mandrels not overlapped by the second block photoresist patterns through etching; etching through the first hard mask layer to form recesses in the dielectric layer, and removing all remaining first hard mask layer and any layers above; depositing a metal layer to fill the recesses; and planarizing the metal layer to expose top surface of the dielectric layer to form the mandrel metal lines and the non-mandrel metal lines, in which the first density assist mask patterns are for printing the first dummy photoresist patterns, the second density assist mask patterns are for printing the second dummy photoresist patterns, combination of the first block mask patterns and the first density assist mask patterns has a pattern density about 30% or greater in the non-mandrel block mask, and combination of the second block mask patterns and the second density assist mask patterns has a pattern density about 30% or greater in the mandrel block mask.

According to another aspect of the present invention, there is provided a method of generating mask layouts for self-aligned block patterning including: identifying metal line patterns to be formed on a semiconductor substrate; generating a mandrel mask layout for a mandrel mask based on the metal line patterns in view of the self-aligned block patterning (SAB) process for forming a plurality of mandrels on the semiconductor substrate, the mandrel mask layout including a plurality of mandrel patterns; generating a non-mandrel block mask layout for a non-mandrel block mask based on the mandrel mask layout for cutting metal lines formed under gaps between spacers in non-mandrel area on the semiconductor substrate, the non-mandrel block mask layout including a plurality of first block patterns and a plurality of first density assist patterns; and generating a mandrel block mask layout for a mandrel block mask based on the mandrel mask layout for cutting metal lines formed under mandrel area on the semiconductor substrate, the mandrel block mask layout including a plurality of second block patterns and a plurality of second density assist patterns, in which the spacers are formed on both sidewalls of each of the plurality of mandrels on the semiconductor substrate in the SAB process, combination of the plurality of first block patterns and the plurality of first density assist patterns has a pattern density about 40% or greater in the non-mandrel block mask layout, and combination of the plurality of second block patterns and the plurality of second density assist patterns has a pattern density about 40% or greater in the mandrel block mask layout.

According to another aspect of the present invention, there is provided a method of manufacturing an integrated circuit including generating mask layouts, which includes steps of: identifying metal line patterns to be formed on a semiconductor substrate; generating a mandrel mask layout for a first mask based on the metal line patterns in view of a self-aligned double patterning (SADP) process for forming a plurality of mandrels on the semiconductor substrate, the mandrel mask layout comprising a plurality of mandrel patterns; generating a non-mandrel block mask layout for a second mask based on the mandrel mask layout for cutting metal lines formed under gaps between spacers in non-mandrel area on the semiconductor substrate, the non-mandrel block mask layout comprising a plurality of first block patterns and a plurality of first density assist patterns; generating a mandrel block mask layout for third mask based on the mandrel mask layout for cutting metal lines formed under mandrel area on the semiconductor substrate, the mandrel block mask layout comprising a plurality of second block patterns and a plurality of second density assist patterns; generating masks according to the mask layouts; and manufacturing the integrated circuit using the masks.

The mask layouts provided in the present invention may have a pattern density of 30% or greater, preferably 40% or greater, thus the masks with the mask layouts and the metal lines fabricated with the masks of the present invention may have better uniformity. When EUV lithography is used, the EUV masks with the mask layouts of the present invention may have better uniformity and lower defect level, and metal lines fabricated with the EUV masks may also have better uniformity and lower defect level.

BRIEF DESCRIPTION OF THE DRAWINGS

The present invention may best be understood from the following detailed description of preferred embodiments, taken in conjunction with the accompany drawings, and in which.

Figure 1:
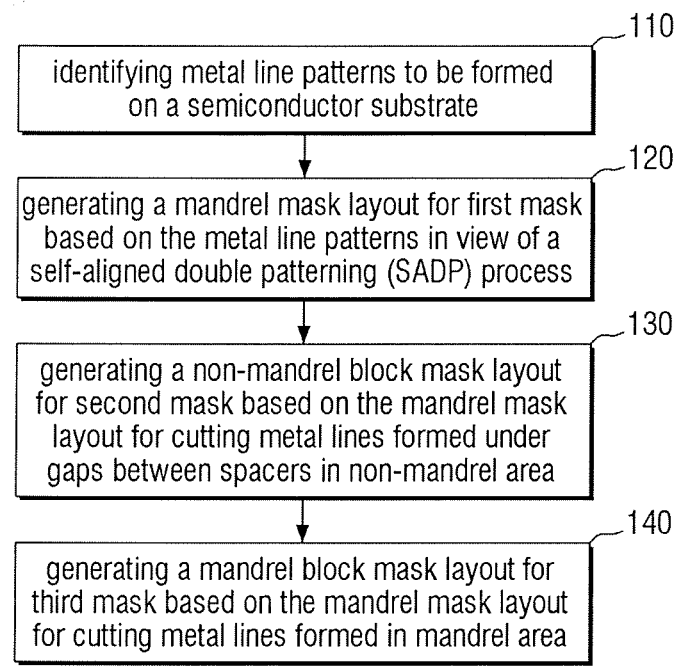
FIG. 1 is a flow chart of a method of generating mask layouts for self-aligned block patterning process according to an exemplary embodiment of the present invention.

Since the drawings in FIGS. 1-16 are intended for illustrative purpose, the elements in the drawings are not necessarily drawn to scale. For example, some of the elements may be enlarged or exaggerated for clarity purpose.

DETAILED DESCRIPTION OF PREFERRED EMBODIMENTS

This invention relates generally to a method of generating mask layouts including density assist patterns for self-aligned block (SAB) patterning process and a method of using masks with the layouts thereof for the SAB patterning process. Specifically, the present invention relates to a method of generating SAB patterning mask layouts which include density assist patterns to increase pattern density, so that the masks with the layouts will have better uniformity. Low pattern density in mask may cause uniformity issue. For EUV mask, higher pattern density may also reduce the number of natural defects of the blank, because the defects may be covered by the absorber. Thus, higher pattern density will not only increase uniformity, but also reduce defect level in EUV mask. Usually, the mask features are linearly imaged onto a wafer. As a result, metal lines fabricated by the SAB patterning process using the above described masks with higher pattern density (e.g., ≥30%) will have better uniformity. Accordingly, the present invention will resolve the low pattern density issue (e.g., <10%) of the current masks used in the self-aligned block patterning process. Exemplary embodiments of the present invention provide a method of generating mask layouts including density assist patterns for SAB patterning process, and a method of using masks with the layouts thereof, in which the density assist patterns formed on the masks only print dummy photoresist patterns which do not interfere the metal line cutting process.

It will be understood that when an element such as a layer, region or substrate is referred to as being "on" or "over" another element, it can be directly on or over the other element or intervening elements may also be present. In contrast, when an element is referred to as being "directly on" or "directly over" another element, there are no intervening elements present. As used herein, the singular forms "a", "an" and "the" are intended to include the plural forms as well, unless the context clearly indicates otherwise.

A relationship described herein between one element of one substrate or mask to another element of another substrate or mask is under the assumption that the relationship would occur if these two elements are in the same substrate or mask, and it does not mean that the relationship is really occurred. For example, a statement "Element A of mask A overlaps element B of mask B" means that aligning two masks to each other in a vertical direction, the element A overlaps to the element B. When two masks are separated, element A does not physically overlap element B, but the coordinates of element A in the mask A map is overlapping the corresponding coordinates of the element B in the mask B map. Since the transfer of image from a mask to a wafer is through projection, there is generally a 4× reduction in size from the mask to the wafer. Thus, the correlation of printed image on a wafer or a substrate to a mask used to print the image or other masks cannot just simply do a 1× correlation. In other words, a term "Element A of mask A overlaps element C of substrate C" means that when the element A is printed on the substrate C to form an image A', the image A' overlaps element C. The size of the image A' is one fourth of the element A when the projection is 4× reduction.

Figure 2:
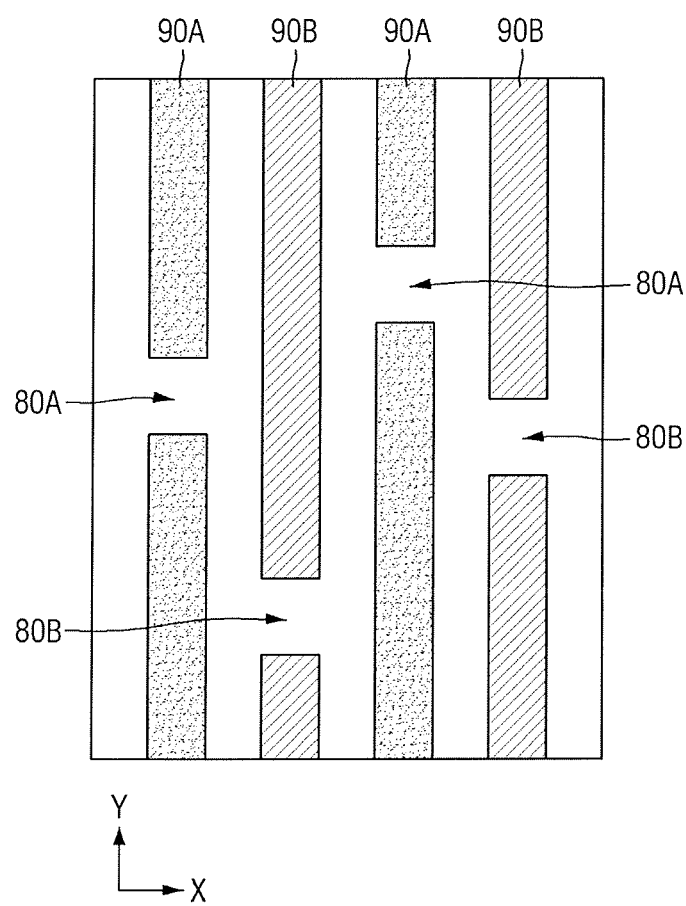
FIG. 2 is a schematic top-view diagram representing metal line patterns on a semiconductor substrate according to an exemplary embodiment of the present invention.

One embodiment of the present invention may include a method of generating mask layouts including density assist patterns for SAB patterning process as illustrated in FIG. 1. FIG. 1 is a flow chart of a method of generating mask layouts for SAB patterning process. The mask layouts generated by the method may provide higher pattern density, thus the masks with the generated mask layouts will have better uniformity. As a result, metal lines fabricated by the SAB patterning process using the masks with the generated mask layouts will have better uniformity At block 110 of FIG. 1, metal line patterns to be formed on a semiconductor substrate may be identified. The metal line patterns may be formed for a specific circuitry, and may have various shapes and sizes arranged in various ways. After the metal line patterns are identified, the mask layouts may be generated accordingly, so that the desired metal line patterns may be formed on the semiconductor substrate. FIG. 2 is a schematic top-view diagram representing metal line patterns on a semiconductor substrate. The specific shape and arrangement of the metal line patterns in FIG. 2 are shown as an example, and the present invention is not limited thereto. For example, they may be modified in various ways to fit the need of any desired circuitries. In SAB patterning process, two spacers are formed on two side surfaces of each mandrel line. After the mandrels are pulled, metal lines are formed in the dielectric layer under the mandrel areas and non-mandrel areas between spacers. Metal lines that are defined by mandrel areas are often called mandrel metal lines while other metal lines are called non-mandrel metal lines. The identified metal line patterns shown in FIG. 2 may include a plurality of mandrel metal lines 90A and a plurality of non-mandrel metal lines 90B alternately arranged and spaced apart from each other in a first direction (X direction), and extending parallelly in a second direction (Y direction). Each mandrel metal line 90A may be separated (cut) by one or more line gaps 80A to form functional segments of the mandrel metal line 90A, and each non-mandrel metal line 90B may be separated (cut) by one or more line gaps 80B to form functional segments of the non-mandrel metal line 90B.

Figure 3:
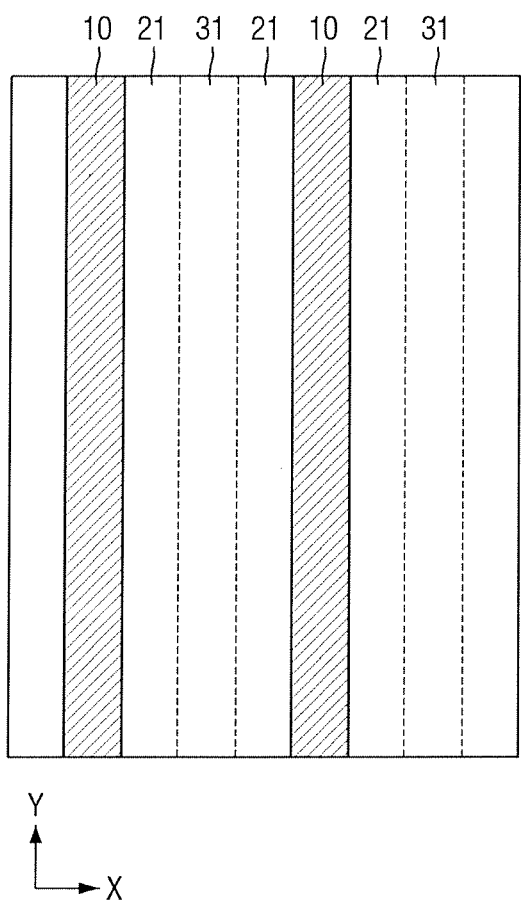
FIG. 3 is a schematic top-view diagram representing a mandrel mask layout according to an exemplary embodiment of the present invention.

At block 120 of FIG. 1, a mandrel mask layout for first mask based on the metal line patterns in view of an SADP process may be generated. The first mask is a mandrel mask for forming a plurality of mandrels on the semiconductor substrate, and the mandrel mask layout includes a plurality of mandrel patterns 10 as shown in FIG. 3. FIG. 3 is a schematic top-view diagram representing a mandrel mask layout. The plurality of mandrel patterns 10 in the mandrel mask layout may be corresponding to the plurality of the mandrel metal lines 90A to be formed on the semiconductor substrate, or corresponding to the mandrels to be formed on the semiconductor substrate during the SADP or SAB patterning process. In other words, the plurality of mandrel patterns 10 of the mandrel mask layout may be overlapping and superimposed with the plurality of mandrel metal lines 90A on the semiconductor substrate. As described above, there is a 4× reduction from the mask to the semiconductor substrate, and therefore the correlation between the mask (or the mask layout) and the semiconductor substrate is based on the corresponding image transfer from the mask to the semiconductor substrate, and is not based on the real physical size of each. In the SADP process, two spacers are formed on two side surfaces of each mandrel line. Since the generation of the mandrel mask layout for the first mask is based on the metal line patterns on the semiconductor substrate in view of the SADP process, there is a space, which includes two space areas 21 and one space area 31, between two adjacent mandrel patterns 10 in the mandrel mask layout corresponding to spacers and gap between spacers on the semiconductor substrate, respectively. In FIG. 3, the space areas 21 in the mandrel mask layout may be corresponding to the spacers on the semiconductor substrate, and the space areas 31 may be corresponding to the gaps between spacers in the non-mandrel area. In other words, the mandrel mask is only used to print mandrels, but may leave the required space between the mandrel patterns for the formation of spacers and gaps between spacers in the SADP process and/or the SAB patterning process. The sizes of the space and the mandrel pattern in the mandrel mask layout may be adjusted based on the expected variation on the sizes of the mandrel, the spacer and the gap between spacers created on the semiconductor substrate during the SADP process and/or the SAB patterning process.

Figure 4:
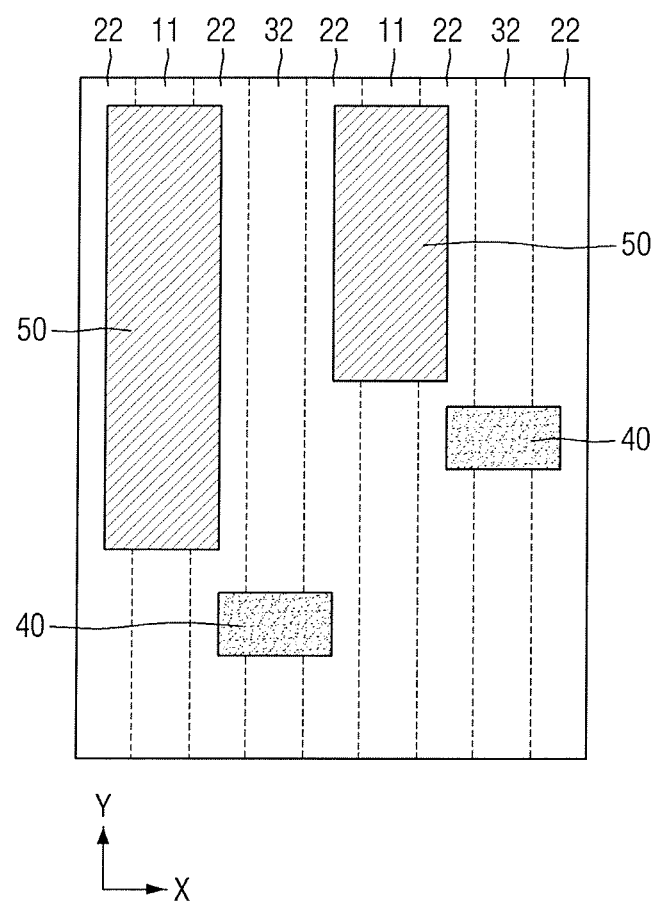
FIG. 4 is a schematic top-view diagram representing a non-mandrel block mask layout according to an exemplary embodiment of the present invention.

At block 130 of FIG. 1, a non-mandrel block mask layout for second mask based on the mandrel mask layout for cutting metal lines formed under gaps between spacers in non-mandrel area on the semiconductor substrate may be generated. The second mask is a non-mandrel block mask of which the non-mandrel block mask layout may include a plurality of first block patterns 40 and a plurality of first density assist patterns 50 as shown in FIG. 4. FIG. 4 is a schematic top-view diagram representing the non-mandrel block mask layout. In FIG. 4, space areas 22 in the non-mandrel block mask layout may be corresponding to the spacers on the semiconductor substrate, space areas 32 in the non-mandrel block mask layout may be corresponding to the gaps between spacers in the non-mandrel area on the semiconductor substrate, and space areas 11 may be corresponding to the mandrel metal lines 90A on the semiconductor substrate, or corresponding to the mandrels on the semiconductor substrate. At the same time, space areas 22, 32 and 11 in the non-mandrel block mask layout may be corresponding to the space areas 21, 31 and 10 in the mandrel mask layout, respectively. The first block patterns 40 are for cutting non-mandrel metal lines, and may be corresponding to the line gaps 80B to separate the non-mandrel metal lines 90B. In FIG. 4, the first block pattern 40 is shown to overlap the gap between two spaces (space area 32) in the non-mandrel area, and to overlap about half of the width each of the two spacers (space areas 22) to be formed on the semiconductor substrate. However, the present invention is not limited thereto. For example, the first block pattern 40 may extend in the first direction (X-direction) to overlap the two (may be up to 4) spacers (space areas 22) and two mandrels (space areas 11) on both sides of the gap between two spacers (space area 32), or just to overlap the gap between two spacers (space area 32). To avoid overlay concern, the extension of the first block pattern 40 may be chosen between the two of above.

To generate the first density assist pattern 50, the first step is to locate the plurality of mandrel patterns 10 in the mandrel mask layout, and then the plurality of first density assist patterns 50 may be generated in the non-mandrel block mask layout so as to overlap the plurality of mandrel patterns 10 of the mandrel mask layout. That is, the first density assist patterns 50 may be generated to overlap the space area 11 in the non-mandrel block mask layout. The plurality of first density assist patterns 50 do not overlap areas corresponding to the gaps between the spacers (space areas 32) in non-mandrel area. Each of the first density assist patterns 50 in the non-mandrel block mask layout may overlap each corresponding mandrel of the plurality of mandrels (space area 11) and at least half width each of two spacers (space areas 22) on both sidewalls of the corresponding mandrel, and may extend in the second direction (Y direction) along with the corresponding mandrel to be formed on the semiconductor substrate. The first density assist pattern 50 may only overlap just the space area 11 or overlap the space area 11 and full width of both space areas 22 on both sides of the space area 11. To avoid overlay issue, it is better to overlap some width but not full width of the two space areas 22, and for increasing pattern density for the non-mandrel mask layout, it is better to overlap at least half width each of the two space areas 22. Combination of the plurality of first block patterns 40 and the plurality of first density assist patterns 50 may have a pattern density about 30% or greater, and preferably about 40% or greater in the non-mandrel block mask layout. The plurality of first block patterns 40 and the plurality of first density assist patterns 50 may be homogeneously distributed in the non-mandrel block mask layout. The homogeneous distribution described here is only to indicate that there is no special aggregation of patterns in a specific area, and does not mean that the patterns need to be strictly arranged in certain order. The homogeneous distribution of the patterns may be obtained through computer-aided pattern design through simulation and optimization. Similarly, to maximize the pattern density may also be obtained through simulation and optimization. The homogeneous distribution of the patterns will provide better uniformity for the non-mandrel block mask, and when the mask is an EUV mask, the homogeneously distributed first block patterns and first density assist patterns will more efficiently reduce the defect level in the EUV mask.

Figure 5:
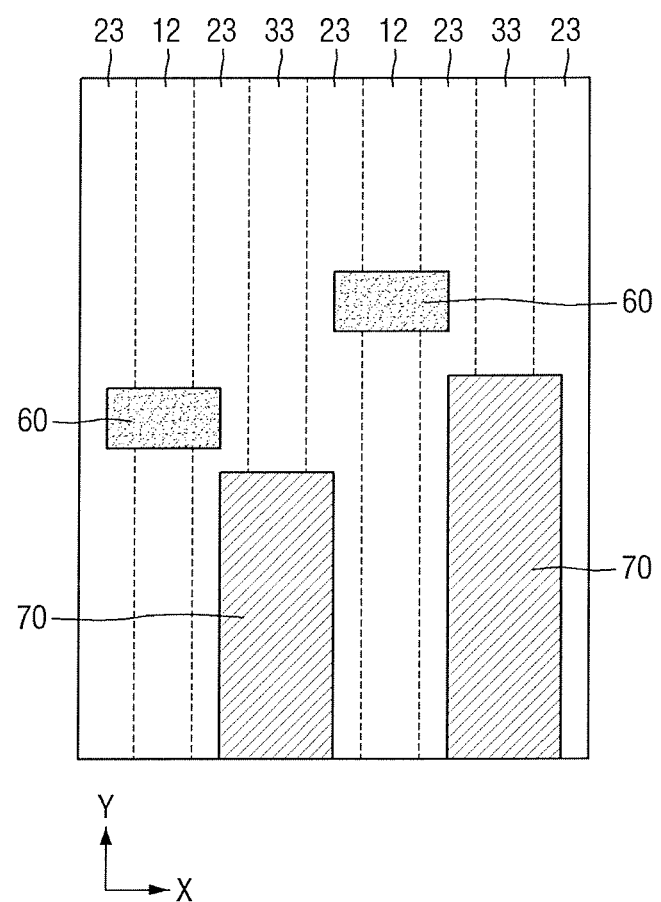
FIG. 5 is a schematic top-view diagram representing a mandrel block mask layout according to an exemplary embodiment of the present invention.

At block 140 of FIG. 1, a mandrel block mask layout for third mask based on the mandrel mask layout for cutting metal lines formed in mandrel area on the semiconductor substrate may be generated. The mandrel block mask layout may include a plurality of second block patterns 60 and a plurality of second density assist patterns 70 as shown in FIG. 5. FIG. 5 is a schematic top-view diagram representing a mandrel block mask layout. In FIG. 5, space areas 23 in the mandrel block mask layout may be corresponding to the spacers on the semiconductor substrate, space areas 33 in the mandrel block mask layout may be corresponding to the gaps between spacers in the non-mandrel area on the semiconductor substrate, and space areas 12 may be corresponding to the mandrel metal lines 90A on the semiconductor substrate, or corresponding to the mandrels on the semiconductor substrate. At the same time, space areas 23, 33 and 12 in the mandrel block mask layout may be corresponding to the space areas 21, 31 and 10 in the mandrel mask layout, respectively. The second block patterns 60 are for cutting mandrel metal lines, and may be corresponding to the line gaps 80A to separate (cut) the mandrel metal lines 90A. In FIG. 5, the second block pattern 60 is shown to overlap the mandrel (space area 12), and to overlap about half of the width each of the two spacers (space areas 23) to be formed on the semiconductor substrate. However, the present invention is not limited thereto. For example, the second block pattern 60 may extend in the first direction (X-direction) to overlap the two spacers (may be up to 4) (space areas 23) and two gaps each between two spacers (space areas 33) on both sides of the mandrel (space area 12), or just to overlap the mandrel (space area 12). To avoid overlay concern, the extension of the second block pattern 60 may be chosen between the two of above.

To generate the second density assist pattern 70, the first step is to locate the plurality of mandrel patterns 10 in the mandrel mask layout, and then the plurality of second density assist patterns 70 may be generated in the mandrel block mask layout so as not to overlap the plurality of mandrel patterns 10 of the mandrel mask layout. That is, the second density assist patterns 70 may be generated to overlap at least the areas corresponding to the gaps between the spacers (space areas 33) in non-mandrel area. Each of the second density assist patterns 70 in the mandrel block mask layout may overlap each corresponding gap of the gaps between spacers (space areas 33) in non-mandrel area and at least half width of each two spacers (space areas 23) adjacent to the corresponding gap, and extends in the second direction (Y direction) along with the corresponding gap (space area 33) to be formed on the semiconductor substrate. The second density assist pattern 70 may only overlap just the space area 33 or may overlap the space area 33 and full width of both space areas 23 on both sides of the space area 33. To avoid overlay issue, it is better to overlap some width but not full width of the two space areas 23, and for increasing pattern density for the mandrel mask layout, it is better to overlap at least half width each of the two space areas 23. Combination of the plurality of second block patterns 60 and the plurality of second density assist patterns 70 may have a pattern density about 30% or greater, and preferably about 40% or greater in the mandrel block mask layout. The plurality of second block patterns 60 and the plurality of second density assist patterns 70 may be homogeneously distributed in the mandrel block mask layout. To obtain the homogeneous distribution of the patterns may be obtained through computer-aided pattern design through simulation and optimization. The homogeneous distribution of the patterns will provide better uniformity for the mandrel block mask, and when the mask is an EUV mask, the homogeneously distributed second block patterns and second density assist patterns will more efficiently reduce the defect level in the EUV mask. Each of the mandrel mask, the non-mandrel block mask and the mandrel block mask of the present invention may independently be a deep UV mask, for example, 193 nm photo mask, or an EUV mask.

Figure 6:
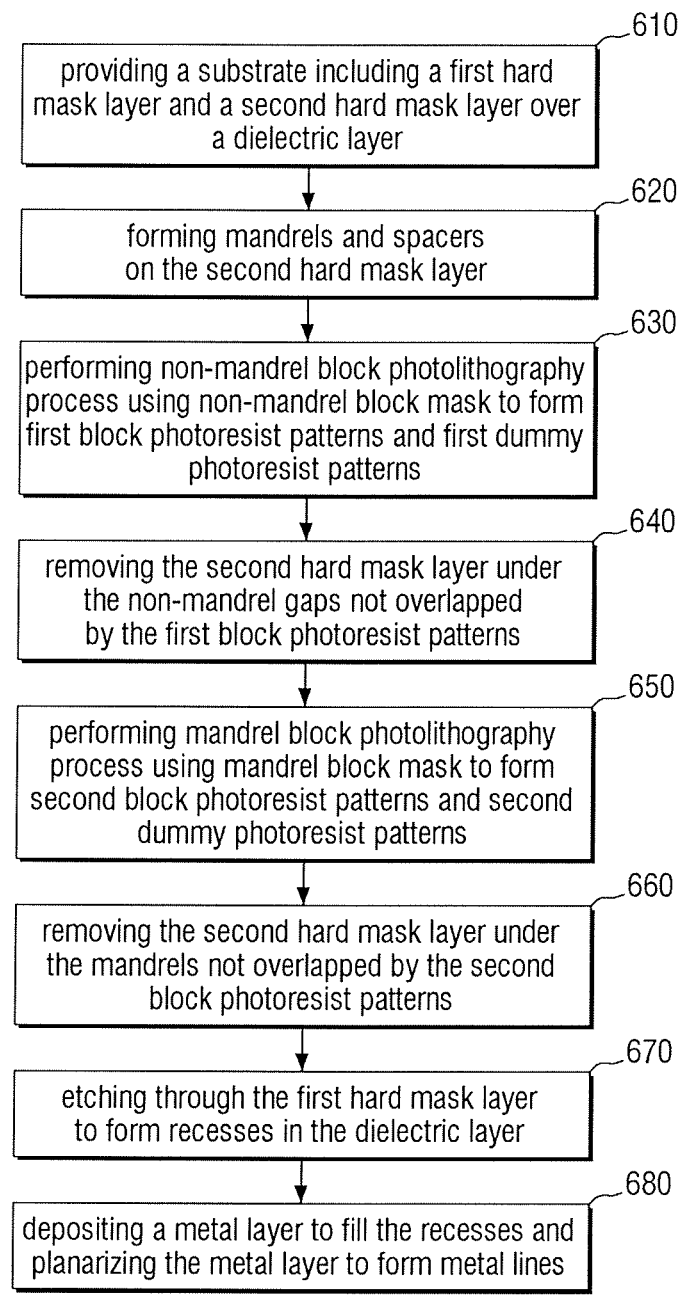
FIG. 6 is a flow chart of a method of self-aligned block patterning process according to an exemplary embodiment of the present invention.

According to an exemplary embodiment of the present invention, a self-aligned block patterning method may include the following steps: providing a substrate including a first hard mask layer and a second hard mask layer over a dielectric layer, with the second hard mask layer being on top of the first hard mask layer; forming a plurality of mandrels and a plurality of spacers on the second hard mask layer, with two spacers being on both sidewalls of each mandrel and a non-mandrel gap formed between two adjacent spacers; performing non-mandrel block photolithography process using non-mandrel block mask to form first block photoresist patterns for cutting non-mandrel metal lines and first dummy photoresist patterns overlapping the mandrels, with the non-mandrel block mask including first block mask patterns and first density assist mask patterns; removing the second hard mask layer under the non-mandrel gaps not overlapped by the first block photoresist patterns through etching; performing mandrel block photolithography process using mandrel block mask to form second block photoresist patterns for cutting mandrel metal lines and second dummy photoresist patterns overlapping the non-mandrel gaps, with the mandrel block mask including second block mask patterns and second density assist mask patterns; removing the second hard mask layer under the mandrels not overlapped by the second block photoresist patterns through etching; etching through the first hard mask layer to form recesses in the dielectric layer, and removing all remaining first hard mask layer and any layers above; depositing a metal layer to fill the recesses; and planarizing the metal layer to expose top surface of the dielectric layer to form the mandrel metal lines and the non-mandrel metal lines, in which the first density assist mask patterns are for printing the first dummy photoresist patterns, the second density assist mask patterns are for printing the second dummy photoresist patterns, combination of the first block mask patterns and the first density assist mask patterns has a pattern density about 30% or greater in the non-mandrel block mask, and combination of the second block mask patterns and the second density assist mask patterns has a pattern density about 30% or greater in the mandrel block mask. The sequence of the steps as described above is preferred. However, the invention is not limited to the performance of these steps with the sequence or order presented above. Many steps may also be applied to the substrate before, between or after the steps shown above. FIG. 6 is a flow chart of the method of self-aligned block patterning process. FIGS. 7-16 are demonstrative illustrations of cross-sectional views in the method of self-aligned block patterning process according to an exemplary embodiment of the present invention.

Figure 7:
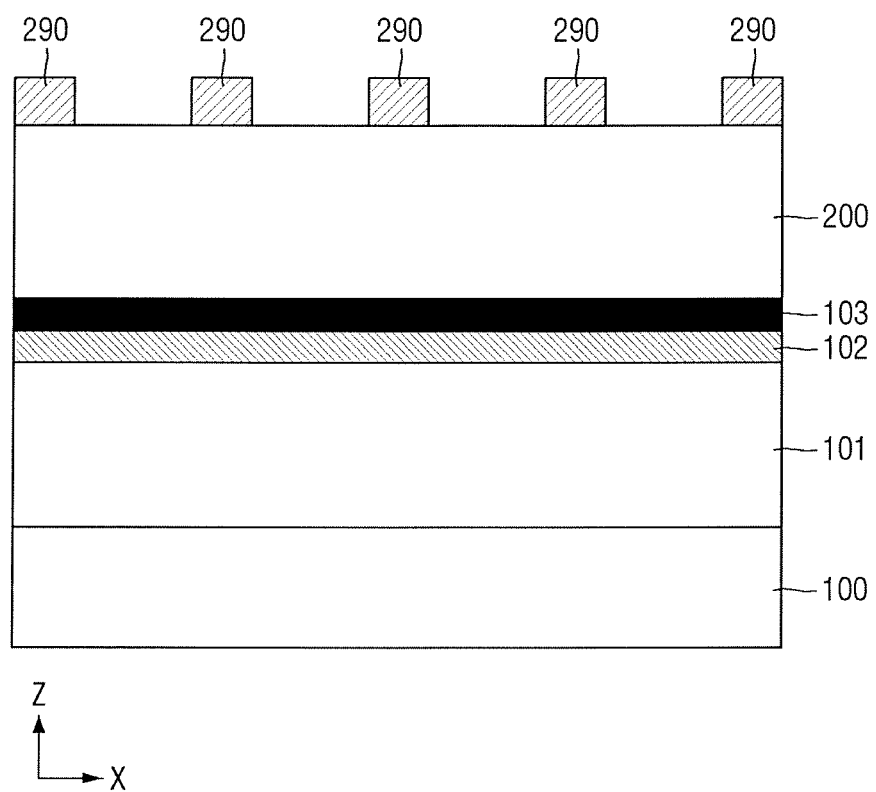
FIG. 7 is a schematic cross-sectional diagram representing mandrel photoresist patterns formed on a mandrel layer according to an exemplary embodiment of the present invention.

At block 610 of FIG. 6, a substrate including a first hard mask layer and a second hard mask layer over a dielectric layer may be provided. As shown in FIG. 7, the dielectric layer 101, the first hard mask layer 102 and the second hard mask layer 103 are sequentially stacked on the substrate 100. The substrate 100 may be any suitable substrate and may include a semiconducting material, such as, for example, silicon (Si), germanium (Ge), silicon germanium (SiGe), silicon carbide (SiC), gallium nitride (GaN) or gallium arsenide (GaAs), a non-semiconducting material such as, for example, silicon oxide ($SiO_2$), aluminum (Al), aluminum oxide ($Al_2O_3$), ceramic, quartz, or copper (Cu), or any combination thereof, including multilayers, for example, germanium on silicon, or silicon on insulator (SOI). For some applications, the substrate 100 may be a semiconductor substrate doped with impurities to render them p-type or n-type. In a p-doped silicon substrate, the Si substrate may be doped with p-type dopants such as, for example, boron (B), aluminum (Al), gallium (Ga) and indium (In). In an n-doped silicon substrate, the Si substrate may be doped with n-type dopants such as, for example, antimony (Sb), arsenic (As) and phosphorous (P). The substrate 100 may include one or more semiconductor layers or structures and may include active or operable portions of semiconductor devices. The active or operable portions of the semiconductor devices may include transistors. The dielectric layer 101 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k or ultra-low k (ULK) dielectric materials. The ULK dielectric material is a dielectric material having a dielectric constant of approximately 2.5 or lower, and may include, for example, porous SiCOH. The preferable material for the dielectric layer 101 is ULK dielectric material. The active or operable portions of the semiconductor devices may extend from the substrate to the dielectric layer 101.

The first hard mask layer 102 may include silicon oxide, silicon nitride, silicon oxynitride, boron nitride, metal, metal nitride, and/or metal oxide, and may have a thickness ranging from about 8 nm to about 40 nm. The preferred material for the first hard mask layer 102 is silicon oxynitride. The material for the second hard mask layer 103 is different from that for the first hard mask layer 102, and has an etch property different from that of the first hard mask layer 102 for better etch selectivity in the subsequent etch step. The second hard mask layer 103 may include silicon oxide, silicon nitride, titanium nitride, boron nitride, amorphous carbon, metal, and/or metal oxide, and may have a thickness ranging from about 8 nm to about 50 nm. The preferred material for the second hard mask layer 103 is titanium nitride. Both hard-mask layers may be formed on the substrate 100 with various deposition processes include, but are not limited to: physical vapor deposition (PVD), chemical vapor deposition (CVD), atomic layer deposition (ALD), electrochemical deposition, and spin coating. The second hard mask layer 103 is deposited on top of the first hard mask layer 102.

Figure 8:
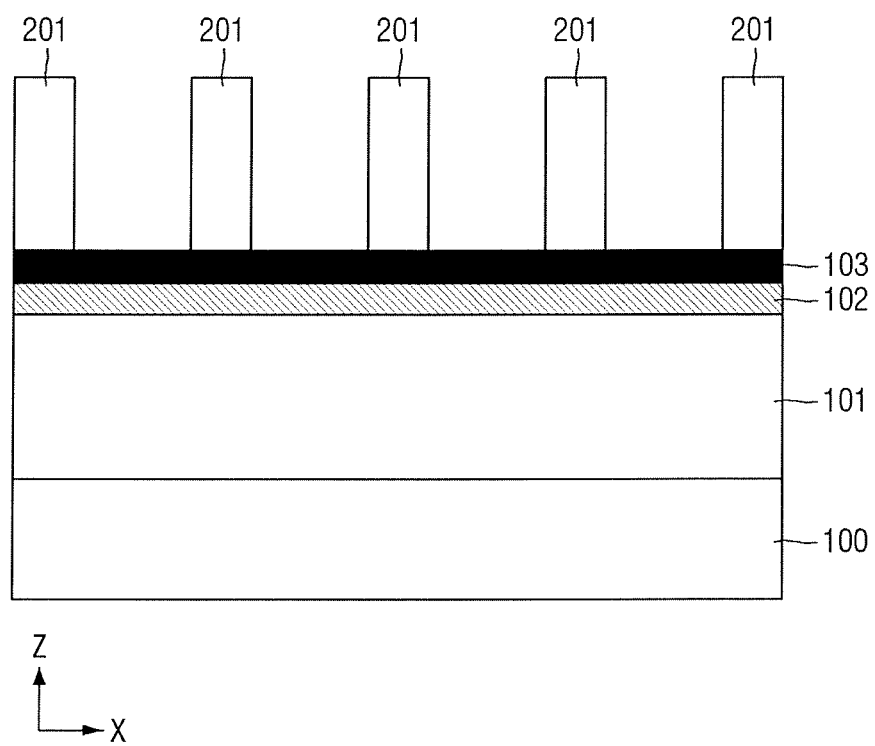
FIG. 8 is a schematic cross-sectional diagram representing a plurality of mandrels formed on second hard mask layer according to an exemplary embodiment of the present invention.
Figure 9:
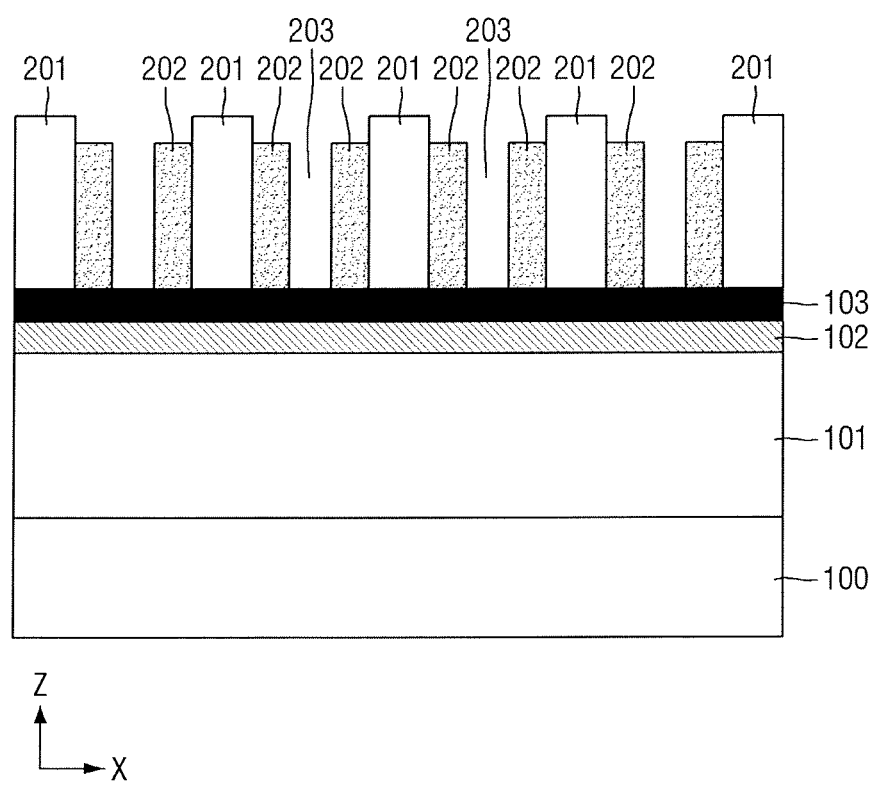
FIG. 9 is a schematic cross-sectional diagram representing two spacers formed on both sidewalls of each mandrel according to an exemplary embodiment of the present invention.

At block 620 of FIG. 6, mandrels and spacers on the second hard mask layer may be formed. The process of forming the mandrels 201 and spacers 202 are illustrated in FIGS. 7-9. The formation of the plurality of mandrels 201 and the plurality of spacers 202 on the second hard mask layer 103 may include the following steps: depositing a mandrel layer 200 on the second hard mask layer 103; spin coating a photoresist layer on the mandrel layer 200; exposing the photoresist layer with a mandrel mask; baking and developing the exposed photoresist layer to form mandrel photoresist patterns 290; and transferring image of the mandrel photoresist patterns 290 to the mandrel layer to form the plurality of mandrels 201; forming a layer of spacer material covering top of the second hard mask layer 103 under opening, and top and sides of the plurality of mandrels 201; and removing spacer material from the top of the second hard mask layer 103, the top of the plurality of mandrels 201, and from sides on two line ends of each mandrel 201 to form the plurality of spacers 202. The sequence of the steps as described above is preferred. However, the invention is not limited to the performance of these steps with the sequence or order presented above. Many steps may also be applied to the substrate before, between or after the steps shown above.

The mandrel layer 200 deposited on the second hard mask layer 103 may be formed of, for example, amorphous silicon. To pattern the mandrel layer 200, a conventional lithography such as, an ArF (193 nm) deep UV (DUV) immersion lithography may be used. A typical photolithographic process may include the following steps: preparing substrate, coating photoresist, baking, exposing and developing. The patterning process may use a positive tone resist with a positive tone development process or may use negative tone development (NTD) process with solvent-based developer. After the photolithographic process, mandrel photoresist patterns 290 are formed above the mandrel layer 200 as shown in FIG. 7. Image of the mandrel photoresist patterns 290 may then be transferred to the mandrel layer 200 through reactive ion etching (RIE) to form the plurality of mandrels 201 as shown in FIG. 8. FIG. 8 is a schematic cross-sectional diagram representing the plurality of mandrels 201 formed on second hard mask layer 103. To form the plurality of spacers 202 on the sidewalls of the mandrels 201 as shown in FIG. 9, a spacer material may be formed to cover the top of the second hard mask layer 103 under opening, and top and sides of the plurality of mandrels 201 by conformally depositing the spacer material onto the substrate using, for example, ALD process. The spacer material may include, for example, silicon oxide, silicon nitride, titanium nitride, boron nitride, amorphous carbon, metal, and/or metal oxide, and may have a thickness ranging from about 4 nm to about 20 nm, which should be proportional to the size of the feature intended to be patterned. The spacer material on the tops of the second hard mask layer 103 and the plurality of mandrels 201 is removed with anisotropic reactive ion etching (RIE). The sides on two line ends of each mandrel 201 are removed by tilt angle ion beam. Thus, the plurality of mandrels 201 and a plurality of spacers 202 may be formed on the second hard mask layer 103, with two spacers 202 being on both sidewalls of each mandrel 210 and a non-mandrel gap 203 formed between two adjacent spacers 202.

Figure 10:
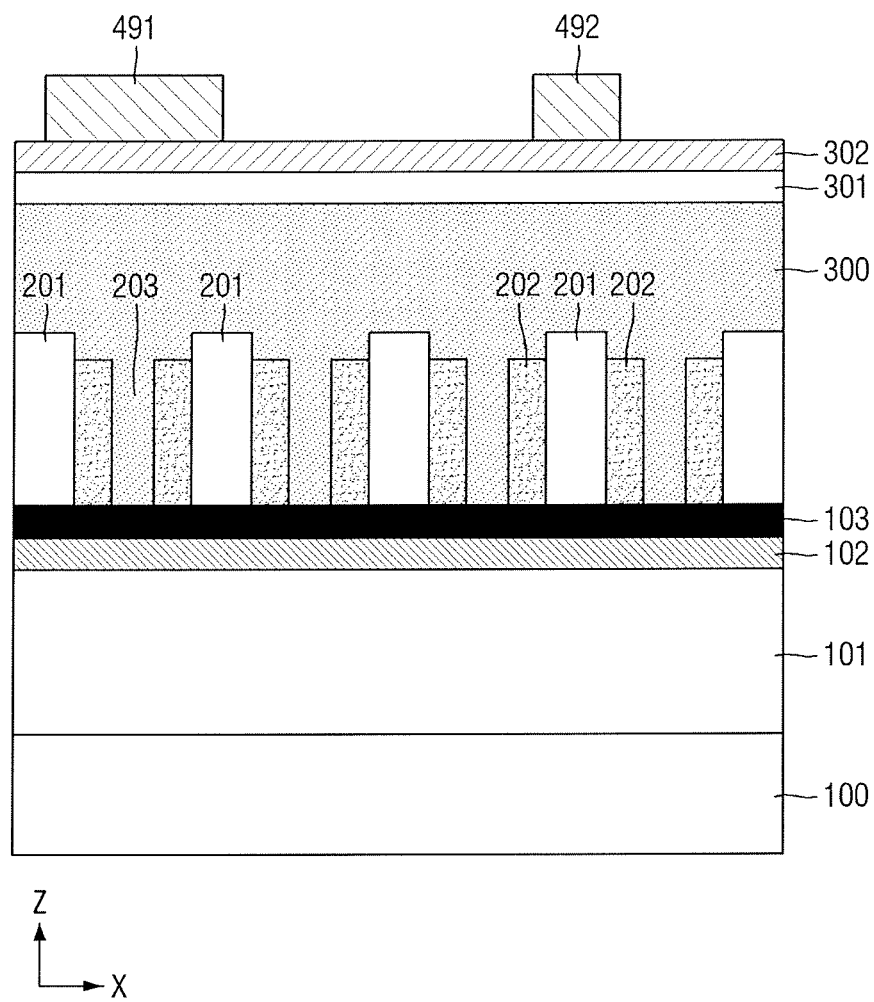
FIG. 10 is a schematic cross-sectional diagram representing a spin-on hard mask layer, a silicon containing interlayer and a bottom antireflective coating sequentially formed over the mandrels and the spacers, and first block photoresist patterns and first dummy photoresist patterns formed over the bottom antireflective coating according to an exemplary embodiment of the present invention.

At block 630 of FIG. 6, non-mandrel block photolithography process using non-mandrel block mask to form first block photoresist patterns and first dummy photoresist patterns may be performed. The first block photoresist patterns 491 are formed for cutting non-mandrel metal lines, and the first dummy photoresist patterns 492 are overlapping the mandrels 201 as shown in FIG. 10. The non-mandrel block mask includes first block mask patterns and first density assist mask patterns. The performing of the non-mandrel block photolithography process may include the following steps: spin coating a spin-on hard mask layer 300 to cover the plurality of mandrels 201, the plurality of spacers 202 and the second hard mask layer 103; depositing a silicon containing interlayer 301 on the spin-on hard mask layer 300; depositing a bottom antireflective coating 302 on the silicon containing interlayer 301; spin coating a photoresist layer on the bottom antireflective coating 302; exposing the photoresist layer with the non-mandrel block mask; and baking and developing the exposed photoresist layer to form the first block photoresist patterns 491 for cutting the non-mandrel metal lines and the first dummy photoresist patterns 492 overlapping the mandrels 201. The sequence of the steps as described above is preferred. However, the invention is not limited to the performance of these steps with the sequence or order presented above. Many steps may also be applied to the substrate before, between or after the steps shown above.

The spin-on hard mask layer 300 may function as a planarization layer, and may have high carbon content. The silicon containing interlayer 301 may be deposited on the spin-on hard mask layer 300 by, for example, CVD or PVD, and may include, for example, silicon oxide, silicon nitride or silicon oxynitride. The bottom antireflective coating 302 on the silicon containing interlayer 301 may have strong absorption at the exposure wavelength, and may have high etch rate. Alternatively, a silicon containing antireflective coating may be spin coated on top of the spin-on hard mask layer 300 instead of depositing both the silicon containing interlayer 301 through CVD or PVD and the bottom antireflective coating 302 through spin coating. The non-mandrel block mask used in exposing the photoresist layer may include the mask layout illustrated in FIG. 4. The exposure of the photoresist layer may be carried out with a conventional lithography such as, an ArF (193 nm) deep UV (DUV) immersion lithography, or may be carried out with an EUV lithography. The first block pattern 40 of FIG. 4 may be used to print the first block photoresist pattern 491 of FIG. 10, except that the first block pattern 40 only extends in the first direction (X direction) to overlap about half of the width each of the two spacers (space areas 22), while the first block photoresist pattern 491 extends further to overlap two spaces 202 and about half of the width each of the two mandrels 201. Here space areas 11, 22 and 32 of FIG. 4 correspond to 201, 202 and 203 of FIG. 10. The first density assistant patterns 50 of FIG. 4 may be used to print the first dummy photoresist patterns 492 of FIG. 10, except that the arrangement of the first block pattern 40 and the first density assistant patterns 50 in the first direction (X direction) in FIG. 4 is opposite to that of the first block photoresist pattern 491 and the first dummy photoresist patterns 492 of FIG. 10 in the first direction in FIG. 10, as viewed along the first direction (X direction) at the middle of FIG. 4 in the second direction (Y direction). The first density assist patterns 50 may overlap the area corresponding to the mandrel (space area 11) and at least half width each of the area corresponding to the two spacers (space areas 22) on both sidewalls of the mandrel (space area 11) in the non-mandrel block mask layout, while the first dummy photoresist patterns 492 may overlap the mandrel 201 and at least half width each of two spacers 202 on both sidewalls of the mandrel 202 on the substrate. The first dummy photoresist patterns 492 may overlap the mandrel 201 and some or the whole width each of two spacers 202 on both sidewalls of the mandrel 202, but not the non-mandrel gap 203. Since the combination of the first block mask patterns 40 and the first density assist mask patterns 50 has a pattern density about 30% or greater in the non-mandrel block mask, the combination of the first block photoresist pattern 491 and the first dummy photoresist patterns 492 may also have a pattern density about 30% or greater on the substrate. The preferable pattern density above is about 40% or greater.

Figure 11:
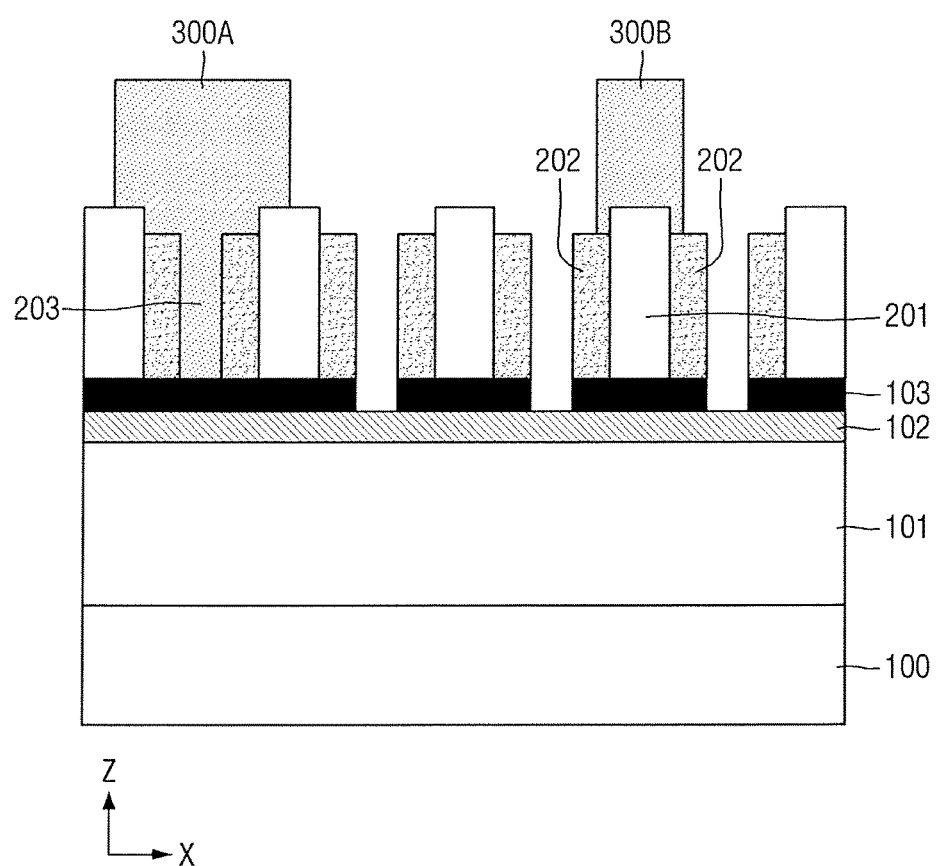
FIG. 11 is a schematic cross-sectional diagram representing the second hard mask layer under non-mandrel gaps not overlapped by the first block photoresist patterns being removed, and portion of the spin-on hard mask layer and the second hard mask layer under the first block photoresist patterns and portion of the spin-on hard mask layer under the first dummy photoresist patterns remaining according to an exemplary embodiment of the present invention.

At block 640 of FIG. 6, the second hard mask layer under the non-mandrel gaps not overlapped by the first block photoresist patterns may be removed. FIG. 11 is a schematic cross-sectional diagram representing the second hard mask layer 103 under non-mandrel gaps 203 not overlapped by the first block photoresist patterns 491 being removed, and portion of the spin-on hard mask layer 300A and the second hard mask layer 103 under the first block photoresist patterns 491 remaining. Portion of the spin-on hard mask layer 300B under the first dummy photoresist patterns 492 also remains. The removing of the second hard mask layer 103 under the non-mandrel gaps 203 not overlapped by the first block photoresist patterns 491 may include the following steps: removing the bottom antireflective coating 302 not covered by the first block photoresist patterns 491 and the first dummy photoresist patterns 492; transferring image of the first block photoresist patterns 491 and the first dummy photoresist patterns 492 to the silicon containing interlayer 301; performing directional etching to remove the spin-on hard mask layer 300 using the imaged silicon containing interlayer 301 as an etching mask; and performing directional etch to remove the second hard mask layer 103 under the non-mandrel gaps 203 using remaining spin-on hard mask layer 300A and 300B, the spacers 202 and the mandrels 201 as etching masks, and using the first hard mask layer 102 as an etch-stop layer.

Since the bottom antireflective coating 302 has high etch rate, the exposed portion may be easily removed with a short time etch using $O_2$ etchant or using a reducing plasma, for example, $N_2$, $H_2$, $NH_3$ or combinations thereof. To etch the silicon containing interlayer 301, fluorine containing etchant, for example, $CF_4$, $CHF_3$, $CH_2F_2$, $CH_3F$, or any combination thereof, may be used. After etching the silicon containing interlayer 301, the etch chemistry may be changed back to etch the carbon rich spin-on hard mask layer 300 using $O_2$ etchant or using a reducing plasma, for example, $N_2$, $H_2$, $NH_3$ or combinations thereof. After finishing the etching of the spin-on hard mask layer 300, the first block photoresist patterns 491 and the first dummy photoresist patterns 492 are usually consumed, and the silicon containing interlayer 301 may or may not completely consumed. When the second hard mask layer 103 is titanium nitride, directional RIE with chlorine based etchants may be used to remove the second hard mask layer 103 under the non-mandrel gaps 203 using remaining spin-on hard mask layer 300A and 300B, the spacers 202 and the mandrels 201 as etching masks, and using the first hard mask layer 102 as an etch-stop layer. As shown in FIGS. 10 and 11, the first dummy photoresist patterns 492 do not participate in the blocking/cutting mechanism and do not interfere the blocking/cutting process. That is, the first density assist mask patterns 50 may be incorporated into the non-mandrel block mask to increase pattern density without interfering the SAB patterning process.

Figure 12:
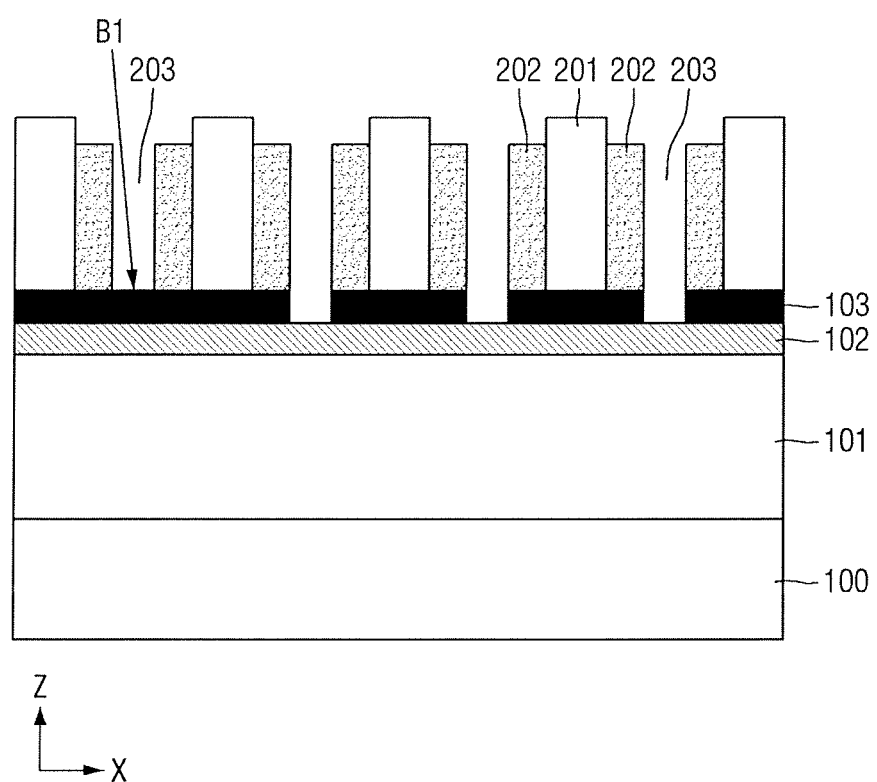
FIG. 12 is a schematic cross-sectional diagram representing the remaining spin-on hard mask layer being removed according to an exemplary embodiment of the present invention.

After the removing of the second hard mask layer 103 under the non-mandrel gaps 203 not overlapped by the first block photoresist patterns 491, a step of removing all remaining spin-on hard mask layer 300A and 300B may be performed. As shown in FIG. 12, the first block/cut B1 pattern for the SAB patterning process is transferred to the second hard mask layer 103. The step of removing all remaining spin-on hard mask layer 300A and 300B may be an ashing step, or may be a stripping step using a conventional resist strip process.

Figure 13:
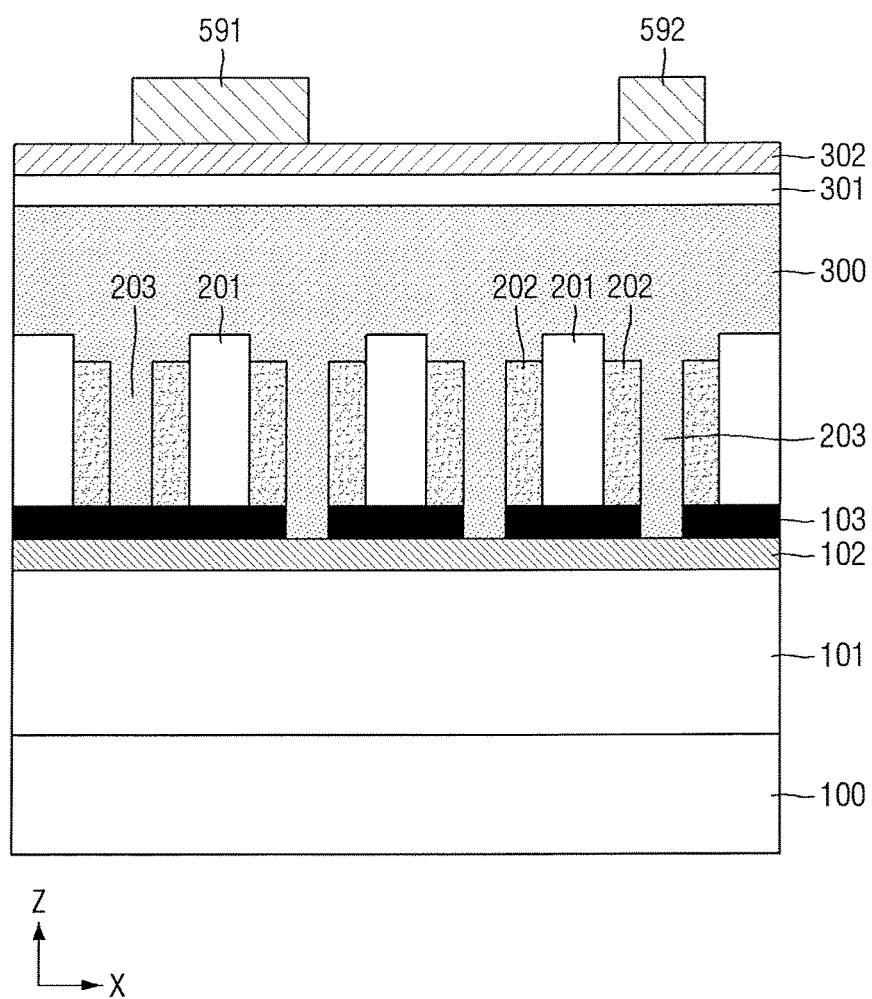
FIG. 13 is a schematic cross-sectional diagram representing a spin-on hard mask layer, a silicon containing interlayer and a bottom antireflective coating sequentially formed over the mandrels and the spacers, and second block photoresist patterns and second dummy photoresist patterns formed over the bottom antireflective coating according to an exemplary embodiment of the present invention.

At block 650 of FIG. 6, mandrel block photolithography process using mandrel block mask to form second block photoresist patterns and second dummy photoresist patterns may be performed. The second block photoresist patterns 591 are formed for cutting mandrel metal lines, and the second dummy photoresist patterns 592 are overlapping the non-mandrel gaps 203 as shown in FIG. 13. The mandrel block mask may include second block mask patterns and second density assist mask patterns. The performing of the mandrel block photolithography process may include the following steps: spin coating a spin-on hard mask layer 300 to cover the plurality of mandrels 201, the plurality of spacers 202 and the second hard mask layer 103; depositing a silicon containing interlayer 301 on the spin-on hard mask layer 300; depositing a bottom antireflective coating 302 on the silicon containing interlayer 301; spin coating a photoresist layer on the bottom antireflective coating 302; exposing the photoresist layer with the mandrel block mask; and baking and developing the exposed photoresist layer to form the second block photoresist patterns 591 for cutting the mandrel metal lines and the second dummy photoresist patterns 592 overlapping the non-mandrel gaps 203. The sequence of the steps as described above is preferred. However, the invention is not limited to the performance of these steps with the sequence or order presented above. Many steps may also be applied to the substrate before, between or after the steps shown above.

The mandrel block mask used in exposing the photoresist layer may include the mask layout illustrated in FIG. 5. The exposure of the photoresist layer may be carried out with a conventional lithography such as, an ArF (193 nm) deep UV (DUV) immersion lithography, or may be carried out with an EUV lithography. The second block pattern 60 of FIG. 5 may be used to print the second block photoresist pattern 591 of FIG. 13, except that the second block pattern 60 only extends in the first direction (X direction) to overlap about half of the width each of the two spacers (space areas 23), while the second block photoresist pattern 591 extends further to overlap about half of the width each of the two non-mandrel gaps 203. Here space areas 12, 23 and 33 of FIG. 5 correspond to 201, 202 and 203 of FIG. 13. The second density assist patterns 70 of FIG. 5 may be used to print the second dummy photoresist patterns 592 of FIG. 13. The second density assist patterns 70 may overlap the area corresponding to the non-mandrel gaps (space area 33) and at least half width each of the area corresponding to the two spacers (space areas 23) on both sidewalls of the non-mandrel gap (space area 33) in the mandrel block mask layout, while the second dummy photoresist patterns 592 may overlap the non-mandrel gap 203 and at least half width each of two spacers 202 on both sides of the non-mandrel gap 203 on the substrate. The second dummy photoresist patterns 592 may overlap the non-mandrel gap 203 and some or the whole width each of two spacers 202 on both sides of the non-mandrel gap 203, but not the mandrel 201. Since the combination of the second block mask patterns 60 and the second density assist mask patterns 70 has a pattern density about 30% or greater in the mandrel block mask, the combination of the second block photoresist pattern 591 and the second dummy photoresist patterns 592 may also have a pattern density about 30% or greater on the substrate. The preferable pattern density above is about 40% or greater.

Figure 14:
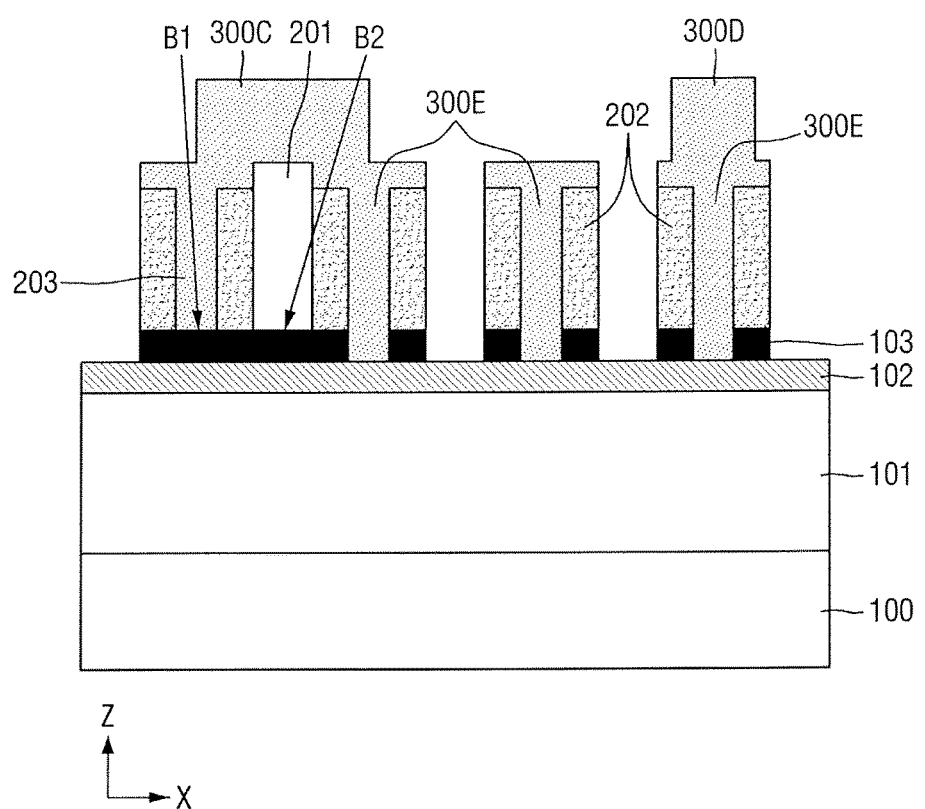
FIG. 14 is a schematic cross-sectional diagram representing the second hard mask layer under the mandrels not overlapped by the second block photoresist patterns being removed, portion of the spin-on hard mask layer, the mandrel and the second hard mask layer under the second block photoresist patterns, and portions of the spin-on hard mask layer in non-mandrel area remaining according to an exemplary embodiment of the present invention.

At block 660 of FIG. 6, the second hard mask layer under the mandrels not overlapped by the second block photoresist patterns may be removed. FIG. 14 is a schematic cross-sectional diagram representing the second hard mask layer 103 under the mandrels 201 not overlapped by the second block photoresist patterns 591 being removed, portion of the spin-on hard mask layer 300C, the mandrel 201 and the second hard mask layer 103 under the second block photoresist patterns 591, and portions of the spin-on hard mask layer 300 D and 300E in non-mandrel area remaining. The removing of the second hard mask layer 103 under the mandrels 201 not overlapped by the second block photoresist patterns 591 may include the following steps: removing the bottom antireflective coating 302 not covered by the second block photoresist patterns 591 and the second dummy photoresist patterns 592; transferring image of the second block photoresist patterns 591 and the second dummy photoresist patterns 592 to the silicon containing interlayer 301; performing directional etch to remove the spin-on hard mask layer 300 using the imaged silicon containing interlayer 301 as an etching mask until the tops of the mandrels 201 are exposed; performing directional etch to remove the exposed mandrels 201; and performing directional etch to remove the second hard mask layer 103 under the mandrels 201 using remaining spin-on hard mask layer 300C, 300D and 300E, and the spacers 202 as etching masks, and using the first hard mask layer 102 as an etch-stop layer.

Removing the mandrels 201 not covered by the remaining spin-on hard mask layer 300C, that may be referred as mandrel pull in this process, may use any conventional etch process selective to the spin-on hard mask layer 300. When the mandrel 201 is amorphous silicon, the mandrels 201 may be etched by RIE with etchants such as: $Cl_2/HBr/CF_4/O_2$, and/or $HBr/O_2$. When the second hard mask layer 103 is titanium nitride, directional RIE with chlorine based etchants may be used to remove the second hard mask layer 103 under the mandrels 201, which are now removed, using remaining spin-on hard mask layer 300C, 300D and 300E, and the spacers 202 as etching masks, and using the first hard mask layer 102 as an etch-stop layer. As shown in FIGS. 13 and 14, the second dummy photoresist patterns 592 do not participate in the blocking/cutting mechanism and do not interfere the blocking/cutting process. That is, the second density assist mask patterns 70 may be incorporated into the non-mandrel block mask to increase pattern density without interfering the SAB patterning process. As shown in FIG. 14, the second block/cut B2 pattern for the SAB patterning process is transferred to the second hard mask layer 103. After the removing of the second hard mask layer 103 under the mandrels 201 not overlapped by the second block photoresist patterns 591, a step of removing all remaining spin-on hard mask layer 300C, 300D and 300E, the spacers 202 and the remaining mandrels 201 may be performed. At least, the all remaining spin-on hard mask layer 300C, 300D and 300E may have to be removed.

Figure 15:
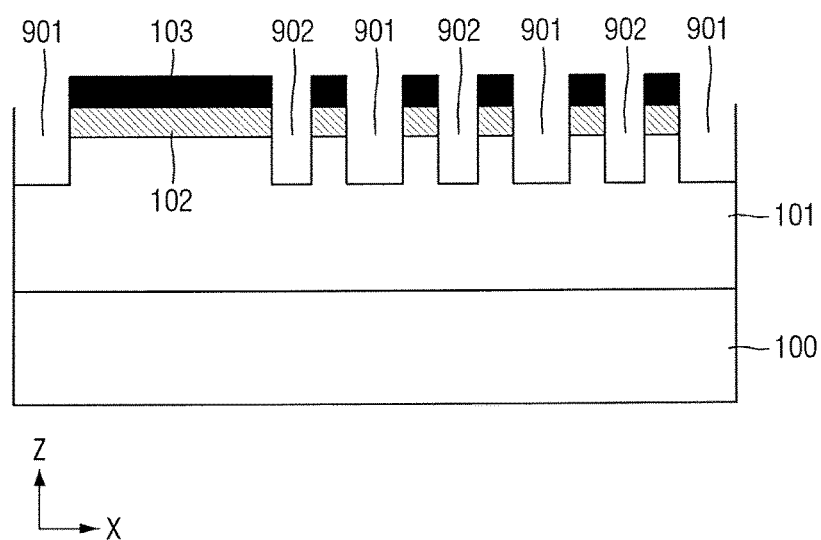
FIG. 15 is a schematic cross-sectional diagram representing recesses formed in the dielectric layer through the first and second hard mask layers according to an exemplary embodiment of the present invention.

At block 670 of FIG. 6, recesses in the dielectric layer may be formed by etching through the first hard mask layer. FIG. 15 is a schematic cross-sectional diagram representing recesses 901 and 902 formed in the dielectric layer 101 through the first and second hard mask layers 102 and 103. When the first hard mask layer 102 is silicon oxynitride, to etch through the first hard mask layer 102 using the patterned second hard mask layer 103 as an etching mask, fluorine containing etchant, for example, $CF_4$, $CHF_3$, $CH_2F_2$, $CH_3F$, $CHF_3+CO$ or any combination thereof, may be used. In FIG. 15, the recesses 901 are defined by mandrels 201, and the recesses 902 are defined by non-mandrel gaps 203. The areas blocked by the first block/cut B1 pattern defined by the blocked non-mandrel gap 203 and the second block/cut B2 pattern defined by the blocked mandrel area 201 do not have recesses. After the formation of the recesses, all remaining first hard mask layer 102 and any layers above may then be removed.

Figure 16:
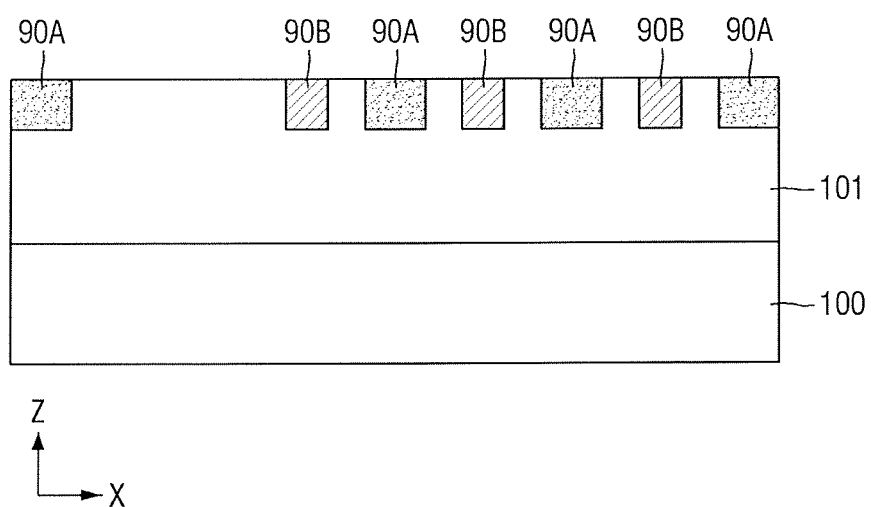
FIG. 16 is a schematic cross-sectional diagram representing metal lines formed in the dielectric layer according to an exemplary embodiment of the present invention.

At block 680 of FIG. 6, a metal layer may be deposited to fill the recesses, and may then be planarized to form metal lines. FIG. 16 is a schematic cross-sectional diagram representing metal lines 90A and 90B formed in the dielectric layer 101. As shown in FIG. 16, the mandrel metal lines 90A are formed in the recesses 901 which are defined by mandrels 201, and the non-mandrel metal lines 90B are formed in the recesses 902 which are defined by non-mandrel gaps 203. The metal layer may include a conductive material which may include, for example, gold (Au), titanium (Ti), copper (Cu), silver (Ag), Aluminum (Al), tungsten (W), cobalt (Co), Chromium (Cr), molybdenum (Mo), zirconium (Zr), nickel (Ni), tantalum (Ta), platinum (Pt), or an alloy thereof. The metal layer may be a multilayer, and may include one or more barrier layers, for example, titanium (Ti), titanium nitride (TiN), tantalum (Ta), tantalum nitride (TaN), tungsten nitride (WN) and/or any combination thereof, to prevent the metal from diffusing into the dielectric layer 101. The conductive material may be formed to fill the recesses 901 and 902 with various deposition processes include, but are not limited to: physical vapor deposition (PVD), chemical vapor deposition (CVD), atomic layer deposition (ALD), electrochemical deposition (ECD), electroplating, electroless plating and spin coating. The planarization of the metal layer may include a planarization process, for example, chemical mechanical polishing (CMP) process to planarize the metal layer until the top surface of the dielectric layer 101 is exposed, thereby forming mandrel metal lines 90A and non-mandrel metal lines 90B in the dielectric layer 101.

As described above, exemplary embodiments of the present invention provide a method of generating mask layouts including density assist patterns for SAB patterning process. The mask layouts provided in the present invention have a pattern density of 30% or greater, or 40% or greater, thus the masks with the mask layouts of the present invention have better uniformity, and in case of EUV masks, the EUV masks with the mask layouts of the present invention may have better uniformity and lower defect level. Exemplary embodiments of the present invention also provide a method of using masks with the layouts to fabricate metal lines with SAB patterning process, and the density assist patterns formed on the mask only print dummy photoresist patterns which do not interfere the metal line cutting process. Thus, the fabricated metal lines have better uniformity, and when EUV lithography is used in the SAB patterning process of the present invention, the fabricated metal lines may have better uniformity and lower defect level.

Although illustrative embodiments of the present invention have been described in detail, it should be understood that the present invention is not intended to be limited to the specific exemplary embodiments disclosed. Based on the foregoing disclosure, those skilled in the art will be able to make various changes, substitutions and alterations without departing from the spirit and scope of the present invention as defined by the following appended claims.

What is claimed is:

1. A method of generating mask layouts for self-aligned block patterning comprising:
    identifying metal line patterns to be formed on a semiconductor substrate;
    generating a mandrel mask layout for first mask based on the metal line patterns in view of a self-aligned double patterning (SADP) process for forming a plurality of mandrels on the semiconductor substrate, the mandrel mask layout comprising a plurality of mandrel patterns;
    generating a non-mandrel block mask layout for second mask based on the mandrel mask layout for cutting metal lines formed under gaps between spacers in non-mandrel area on the semiconductor substrate, the non-mandrel block mask layout comprising a plurality of first block patterns and a plurality of first density assist patterns; and
    generating a mandrel block mask layout for third mask based on the mandrel mask layout for cutting metal lines formed under mandrel area on the semiconductor substrate, the mandrel block mask layout comprising a plurality of second block patterns and a plurality of second density assist patterns,
    wherein, the spacers are formed on both sidewalls of each of the plurality of mandrels on the semiconductor substrate in the SADP process,
    combination of the plurality of first block patterns and the plurality of first density assist patterns has a pattern density about 30% or greater in the non-mandrel block mask layout, and
    combination of the plurality of second block patterns and the plurality of second density assist patterns has a pattern density about 30% or greater in the mandrel block mask layout.

2. The method of claim 1, wherein the metal line patterns comprise a plurality of mandrel metal lines, which are formed under the mandrel area, and a plurality of non-mandrel metal lines, which are formed under the gaps between spacers in non-mandrel area, alternately arranged and spaced apart in a first direction, and extending parallelly to each other in a second direction.

3. The method of claim 2, wherein the plurality of mandrel patterns in the mandrel mask layout are corresponding to the plurality of mandrel metal lines to be formed on the semiconductor substrate, and are used to print images for forming the plurality of mandrel metal lines.

4. The method of claim 1, wherein the generating of the non-mandrel block mask layout comprises:
    locating the plurality of mandrel patterns in the mandrel mask layout; and
    generating the plurality of first density assist patterns in the non-mandrel block mask layout so as to overlap the plurality of mandrel patterns of the mandrel mask layout,
    wherein the plurality of first density assist patterns do not overlap area corresponding to the gaps between spacers in non-mandrel area.

5. The method of claim 4, wherein each of the first density assist patterns in the non-mandrel block mask layout overlaps area corresponding to each mandrel of the plurality of mandrels and at least half width each of two spacers on both sidewalls of the mandrel, and extends in a second direction along with the mandrel to be formed on the semiconductor substrate.

6. The method of claim 1, wherein the generating of the mandrel block mask layout comprises:
    locating the plurality of mandrel patterns in the mandrel mask layout; and
    generating the plurality of second density assist patterns in the mandrel block mask layout so as not to overlap the plurality of mandrel patterns of the mandrel mask layout.

7. The method of claim 6, wherein each of the second density assist patterns in the mandrel block mask layout overlaps area corresponding to each gap of the gaps between spacers in non-mandrel area and at least half width of each two spacers at both sides of the gap between spacers in non-mandrel area, and extends in a second direction along with the gap between spacers in non-mandrel area to be formed on the semiconductor substrate.

8. The method of claim 1, wherein the combination of the plurality of first block patterns and the plurality of first density assist patterns has a pattern density about 40% or greater in the non-mandrel block mask layout, and the combination of the plurality of second block patterns and the plurality of second density assist patterns has a pattern density about 40% or greater in the mandrel block mask layout.

9. The method of claim 1, wherein the plurality of first block patterns and the plurality of first density assist patterns are homogeneously distributed in the non-mandrel block mask layout, and the plurality of second block patterns and the plurality of second density assist patterns are homogeneously distributed in the mandrel block mask layout.

10. The method of claim 1, wherein the first, second and third masks are each independently selected from one of 193 nm photomask and EUV mask.

11. A self-aligned block patterning method comprising:
providing a substrate comprising a first hard mask layer and a second hard mask layer over a dielectric layer, with the second hard mask layer being on top of the first hard mask layer;
forming a plurality of mandrels and a plurality of spacers on the second hard mask layer, with two spacers being on both sidewalls of each mandrel and a non-mandrel gap formed between two adjacent spacers;
performing non-mandrel block photolithography process using non-mandrel block mask to form first block photoresist patterns for cutting non-mandrel metal lines and first dummy photoresist patterns overlapping the mandrels, with the non-mandrel block mask comprising first block mask patterns and first density assist mask patterns;
removing the second hard mask layer under the non-mandrel gaps not overlapped by the first block photoresist patterns through etching;
performing mandrel block photolithography process using mandrel block mask to form second block photoresist patterns for cutting mandrel metal lines and second dummy photoresist patterns overlapping the non-mandrel gaps, with the mandrel block mask comprising second block mask patterns and second density assist mask patterns;
removing the second hard mask layer under the mandrels not overlapped by the second block photoresist patterns through etching;
etching through the first hard mask layer to form recesses in the dielectric layer, and removing all remaining first hard mask layer and any layers thereabove;
depositing a metal layer to fill the recesses; and
planarizing the metal layer to expose top surface of the dielectric layer to form the mandrel metal lines and the non-mandrel metal lines,
wherein the first density assist mask patterns are for printing the first dummy photoresist patterns,
the second density assist mask patterns are for printing the second dummy photoresist patterns,
combination of the first block mask patterns and the first density assist mask patterns has a pattern density about 30% or greater in the non-mandrel block mask, and
combination of the second block mask patterns and the second density assist mask patterns has a pattern density about 30% or greater in the mandrel block mask.

12. The method of claim 11, wherein the first dummy photoresist patterns overlap the mandrels and the spacers, but not the non-mandrel gaps, and the second dummy photoresist patterns overlap the non-mandrel gaps and the spacers, but not the mandrels.

13. The method of claim 11, wherein the combination of the first block mask patterns and the first density assist mask patterns has a pattern density about 40% or greater in the non-mandrel block mask, and the combination of the second block mask patterns and the second density assist mask patterns has a pattern density about 40% or greater in the mandrel block mask.

14. The method of claim 11, wherein the non-mandrel block mask and the mandrel block mask are each independently selected from one of 193 nm photomask and EUV mask.

15. The method of claim 11, wherein the performing of the non-mandrel block photolithography process comprises:
spin coating a spin-on hard mask layer to cover the plurality of mandrels, the plurality of spacers and the second hard mask layer;
depositing a silicon containing interlayer on the spin-on hard mask layer;
depositing a bottom antireflective coating on the silicon containing interlayer;
spin coating a photoresist layer on the bottom antireflective coating;
exposing the photoresist layer with the non-mandrel block mask; and
baking and developing the exposed photoresist layer to form the first block photoresist patterns for cutting the non-mandrel metal lines and the first dummy photoresist patterns overlapping the mandrels.

16. The method of claim 15, wherein the removing of the second hard mask layer under the non-mandrel gaps not overlapped by the first block photoresist patterns comprises:
removing the bottom antireflective coating not covered by the first block photoresist patterns and the first dummy photoresist patterns;
transferring image of the first block photoresist patterns and the first dummy photoresist patterns to the silicon containing interlayer;
performing directional etch to remove the spin-on hard mask layer using the imaged silicon containing interlayer as an etching mask; and
performing directional etch to remove the second hard mask layer under the non-mandrel gaps using remaining spin-on hard mask layer, the spacers and the mandrels as etching masks, and using the first hard mask layer as an etch-stop layer.

17. The method of claim 11, wherein after the removing of the second hard mask layer under the non-mandrel gaps not overlapped by the first block photoresist patterns and before the performing mandrel block photolithography process further comprises a step of removing all remaining spin-on hard mask layer.

18. The method of claim 11, wherein the forming of the plurality of mandrels and the plurality of spacers on the second hard mask layer comprises:
depositing a mandrel layer on the second hard mask layer;
spin coating a photoresist layer on the mandrel layer;
exposing the photoresist layer with a mandrel mask;
baking and developing the exposed photoresist layer to form mandrel photoresist patterns;
transferring image of the mandrel photoresist patterns to the mandrel layer to form the plurality of mandrels;
forming a layer of spacer material covering top of the second hard mask layer under opening, and top and sides of the plurality of mandrels; and
removing spacer material from the top of the second hard mask layer, the top of the plurality of mandrels, and from sides on two line ends of each mandrel to form the plurality of spacers.

19. The method of claim 11, wherein the first hard mask layer comprises silicon oxynitride (SiON), the second hard mask layer comprises titanium nitride (TiN), and the mandrel comprises amorphous silicon (a-Si).

20. The method of claim 11, wherein the substrate is a semiconductor substrate and further comprises transistors in or under the dielectric layer.

21. A method of generating mask layouts for self-aligned block patterning comprising:

identifying metal line patterns to be formed on a semiconductor substrate;
generating a mandrel mask layout for a mandrel mask based on the metal line patterns in view of the self-aligned block patterning (SAB) process for forming a plurality of mandrels on the semiconductor substrate, the mandrel mask layout comprising a plurality of mandrel patterns;
generating a non-mandrel block mask layout for a non-mandrel block mask based on the mandrel mask layout for cutting metal lines formed under gaps between spacers in non-mandrel area on the semiconductor substrate, the non-mandrel block mask layout comprising a plurality of first block patterns and a plurality of first density assist patterns; and
generating a mandrel block mask layout for a mandrel block mask based on the mandrel mask layout for cutting metal lines formed under mandrel area on the semiconductor substrate, the mandrel block mask layout comprising a plurality of second block patterns and a plurality of second density assist patterns,
wherein, the spacers are formed on both sidewalls of each of the plurality of mandrels on the semiconductor substrate in the SAB process,
combination of the plurality of first block patterns and the plurality of first density assist patterns has a pattern density about 40% or greater in the non-mandrel block mask layout, and
combination of the plurality of second block patterns and the plurality of second density assist patterns has a pattern density about 40% or greater in the mandrel block mask layout.

22. The method of claim 21, wherein the generating of the non-mandrel block mask layout comprises:
locating the plurality of mandrel patterns in the mandrel mask layout; and
generating the plurality of first density assist patterns in the non-mandrel block mask layout so as to overlap the plurality of mandrel patterns of the mandrel mask layout,
wherein the plurality of first density assist patterns do not overlap area corresponding to the gaps between spacers in non-mandrel area.

23. The method of claim 21, wherein the generating of the mandrel block mask layout comprises:
locating the plurality of mandrel patterns in the mandrel mask layout; and
generating the plurality of second density assist patterns in the mandrel block mask layout so as not to overlap the plurality of mandrel patterns of the mandrel mask layout.

24. The method of claim 21, wherein the mandrel mask, the non-mandrel block mask and the mandrel block mask are each independently selected from one of 193 nm photomask and EUV mask.

25. A method of manufacturing an integrated circuit comprising:
generating mask layouts comprising steps of:
identifying metal line patterns to be formed on a semiconductor substrate;
generating a mandrel mask layout for a first mask based on the metal line patterns in view of a self-aligned double patterning (SADP) process for forming a plurality of mandrels on the semiconductor substrate, the mandrel mask layout comprising a plurality of mandrel patterns;
generating a non-mandrel block mask layout for a second mask based on the mandrel mask layout for cutting metal lines formed under gaps between spacers in non-mandrel area on the semiconductor substrate, the non-mandrel block mask layout comprising a plurality of first block patterns and a plurality of first density assist patterns;
generating a mandrel block mask layout for third mask based on the mandrel mask layout for cutting metal lines formed under mandrel area on the semiconductor substrate, the mandrel block mask layout comprising a plurality of second block patterns and a plurality of second density assist patterns;
generating masks according to the mask layouts; and
manufacturing the integrated circuit using the masks.

26. The method of claim 25, wherein the spacers are formed on both sidewalls of each of the plurality of mandrels on the semiconductor substrate in the SADP process, wherein
combination of the plurality of first block patterns and the plurality of first density assist patterns has a pattern density about 30% or greater in the non-mandrel block mask layout, and
combination of the plurality of second block patterns and the plurality of second density assist patterns has a pattern density about 30% or greater in the mandrel block mask layout.

* * * * *